United States Patent [19]

Blakeslee et al.

[11] 4,278,474
[45] Jul. 14, 1981

[54] DEVICE FOR CONVERSION OF ELECTROMAGNETIC RADIATION INTO ELECTRICAL CURRENT

[75] Inventors: A. Eugene Blakeslee, Golden; Kim W. Mitchell, Indian Hill, both of Colo.

[73] Assignee: The United States of America as represented by the United States Department of Energy, Washington, D.C.

[21] Appl. No.: 133,702

[22] Filed: Mar. 25, 1980

[51] Int. Cl.³ .......................................... H01L 31/06
[52] U.S. Cl. .................................. 136/249; 136/262; 357/30
[58] Field of Search .......... 136/89 MS, 89 SJ, 89 SG, 136/89 GA, 249, 255, 261, 262; 357/30

[56] References Cited

U.S. PATENT DOCUMENTS

| | | | |
|---|---|---|---|
| 4,017,332 | 4/1977 | James | 136/89 SJ |
| 4,088,515 | 5/1978 | Blakeslee et al. | 148/175 |
| 4,128,733 | 12/1978 | Fraas et al. | 136/89 SJ |
| 4,179,702 | 12/1979 | Lamorte | 357/30 |
| 4,206,002 | 6/1980 | Sabnis et al. | 136/89 MS |

Primary Examiner—Aaron Weisstuch
Attorney, Agent, or Firm—Paul A. Gottlieb; Richard G. Besha; James E. Denny

[57] ABSTRACT

Electromagnetic energy may be converted directly into electrical energy by a device comprising a sandwich of at least two semiconductor portions, each portion having a p-n junction with a characteristic energy gap, and the portions lattice matched to one another by an intervening superlattice structure. This superlattice acts to block propagation into the next deposited portion of those dislocation defects which can form due to lattice mismatch between adjacent portions.

20 Claims, 2 Drawing Figures

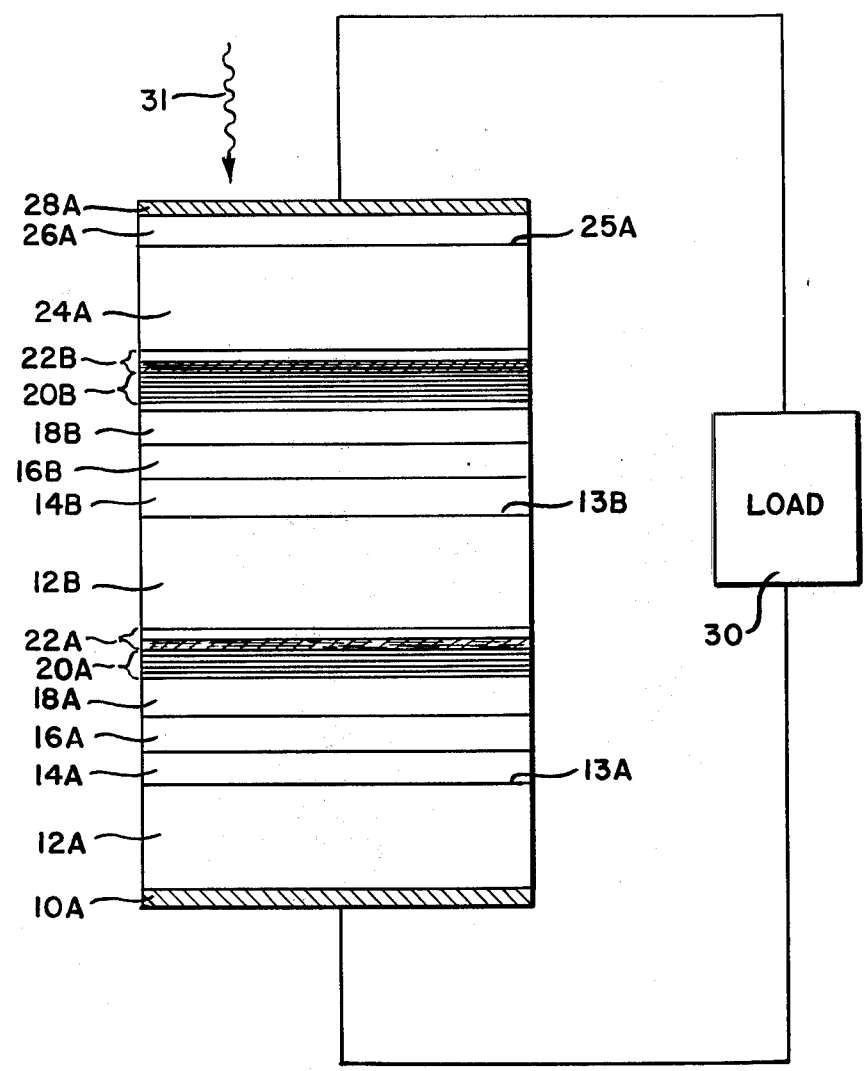

DEVICE FOR CONVERSION OF ELECTROMAGNETIC RADIATION INTO ELECTRICAL CURRENT

CONTRACTUAL ORIGIN OF THE INVENTION

The U.S. Government has rights in this invention pursuant to Contract No. EG-77-C-01-4042 between the U.S. Department of Energy and Midwest Research Institute.

BACKGROUND OF THE INVENTION

In order to carry out an efficient conversion of a spectrum of electromagnetic radiation into electrical current, devices called monolithic cascade converters have been developed which provide multiple, typically two semiconductor junctions within one device, one junction having a low characteristic electromagnetic energy gap and the other junction a high characteristic electromagnetic energy gap. The energies of the low and high energy gaps are chosen so as to optimize coverage of the incident electromagnetic spectrum, thereby maximizing the efficiency of converting incident electromagnetic radiation into electrical energy. For example, the theoretical efficiency for a two-junction device has been calculated to be in excess of 35% near ambient temperature for a typical solar spectrum measured at the earth's surface.

Currently, only group IIIa-Va semiconductor materials technology is sufficiently developed to produce reasonably efficient multiple junction devices. However, in the case of solar cell materials, a substantial portion of the materials and cost is accounted for by the necessity of using GaAs as a substrate material. Gallium metal is in high demand and in limited supply; therefore, the cost of GaAs substrate material is presently about $3.20/cm2 compared with approximately $0.30/cm2 for Si wafers. The end result is that the GaAs substrate represents approximately 25 percent of the total device cost. Further, the thermal conductivity of GaAs is only 0.54 W/cm°C. compared with 1.41 W/cm°C. for Si. In a solar concentrator, the efficiency of converting light to electricity can decrease dramatically if the semiconductor junction temperature increases too much. Therefore, since the thermal conductivity of Si is nearly three times that of GaAs, Si is much more desirable for use in a solar concentrator system than GaAs. However, because Si is not lattice matched to any of the appropriate high energy gap materials, Si has not been utilized as a substrate in an efficient monolithic cascade converter device. Growth of one material on top of another with a difference in lattice parameters between the layers (lattice mismatched) will result in lattice mismatch stresses. These stresses in turn lead to formation of line defects (threading dislocations) in the overlayer, which in the case of a two-junction device is the high energy gap layer. The end result is that these dislocations cause severe degradation of conversion efficiency in the high energy gap portion of the device. It is therefore an object of the present invention to provide a multiple junction, monolithic cascade device for converting incident electromagnetic radiation into electrical energy.

It is also an object of the invention to provide a two-junction, monolithic cascade device for converting incident electromagnetic radiation into electrical energy.

It is also an object of the invention to provide a two-junction monolithic cascade device for conversion of a solar spectrum into electrical energy.

It is a further object of the invention to provide a two-junction, monolithic cascade device for conversion of the solar spectrum into electrical energy having Si as a substrate and low energy gap material.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In a two-junction cascade converter, a low energy gap semiconductor may be used as both a substrate and a low energy gap junction material and may be coupled to a multi-component, high energy gap junction material without propagation of threading dislocations into the high energy gap material. The elimination of threading dislocations, normally arising from lattice mismatch between the substrate and the graded layer, results from use of a dislocation-blocking region called a superlattice layer structure. A theoretical description of the superlattice layer structure was originally set forth by Esaki and Tsu in U.S. Pat. Nos. 3,626,257 and 3,626,328. In U.S. Pat. No. 4,088,515, Matthews and Blakeslee have described a method for producing the superlattice layer structure.

BRIEF DESCRIPTION OF THE DRAWINGS

FIG. 2 is a cross section of the multi-layer structure of a three-junction cascade device.

DETAILED DESCRIPTION OF THE PREFERRED EMBODIMENT

Figure 1:
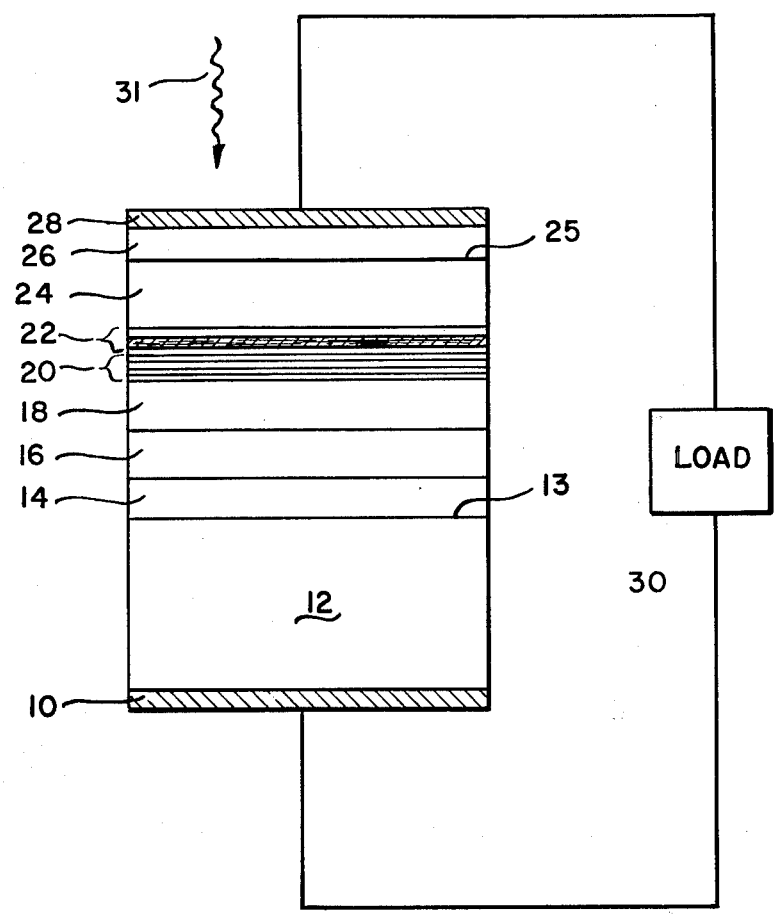
FIG. 1 is a cross section of the multi-layer structure of a two-junction cascade device.

The preferred embodiment is shown in FIGS. 1-2 and is designed to produce an efficient conversion of an incident electromagnetic spectrum into electrical energy. The invention comprises two or more junctions with the device as a whole absorbing the maximum amount of the incident electromagnetic spectrum and converting the electromagnetic energy into electrical energy. For example, a two junction device comprises a low energy gap portion to convert into electrical energy the low energy fraction of the electromagnetic spectrum and a high energy gap portion to convert into electrical energy the high energy fraction of the incident electromagnetic spectrum.

The two-junction monolithic cascade converter in FIG. 1 is based on a semiconductor substrate 12 connected to external load 30 through ohmic contact 10, which is joined to substrate 12 to achieve a low resistance ohmic contact. Substrate 12 may be a p- or n-type semiconductor with sufficient chemical purity, adequate carrier mobility through the substrate material, and other requisite electrical properties to provide adequate electrical conduction, thereby permitting reasonably efficient conversion of electromagnetic radiation to electrical energy. Further, the substrate material should have a characteristic low energy gap. The precise energy for the low energy gap is determined jointly with the high energy gap layer (to be discussed) such that the incident electromagnetic spectrum is collected with maximum efficiency. For example, if the invention is used as a solar cell device at the earth's surface, the low energy gap may be chosen as 1.1 eV and the high energy gap near 1.8 eV to optimize the coverage of the incident solar spectrum.

Ohmic contact 10 may be formed in a number of ways, including evaporation, sputtering, or electrodeposition onto substrate 12. The type of metal chosen is determined by the energy level of the most energetic electrons of the semiconductor, usually characterized as the Fermi energy level. The metal used in contact 10 should have its Fermi level near that of the substrate 12. For example, the preferred ohmic contact 10 for n-type GaAs may be Sn, and for p-type GaAs the contact 10 may be In metal. The thickness of ohmic contact 10 is primarily determined by that amount of thickness required to establish a continuous film and low resistance contact to substrate 12.

Assuming we choose an n-type substrate 12, we form p-type layer 14 typically by diffusion, ion implantation, or homoepitaxial deposition, which establishes a p-n junction 13 at the interface of regions 12 and 14. The optimum thicknesses for substrate 12 and layer 14 are those dimensions which yield the most favorable compromise between maximum absorption of incident radiation and highest efficiency of collection of minority carrier current. For example, if substrate 12 and layer 14 are too thin, some radiation will not be absorbed. If layer 14 is too thick, it is possible that some of the electrical energy will not be collected due to loss of charge carriers at trapping sites during diffusion to the collecting junction 13.

A p-type semiconductor overlayer 16, lattice matched to the substrate 12, is deposited on layer 14, typically by chemical vapor deposition or liquid phase epitaxy. For example, with a (100) Si wafer as substrate 12, a suitable choice for lattice matched layer 14 is GaP which has a 0.37% difference in lattice parameter from the Si substrate. A p-type semiconductor graded layer 18 is grown on lattice-matched layer 16. The graded layer 18 gradually changes in composition over the thickness of the layer to an end composition having the desired energy gap for optimum performance of the high energy gap portion of the device. For example, if Si is used as substrate 12 with a low energy gap of 1.1 eV, a proper choice for a high energy gap material would be $GaAs_{0.7}P_{0.3}$ with an energy gap of 1.8 eV.

In order to prevent propagation of any dislocations from graded layers 18 into the high energy gap portion (to be described), a superlattice 20 is inserted on top of graded layer 18. The specifications necessary for the superlattice region 20 are set forth in U.S. Pat. No. 4,088,515 by Matthews and Blakeslee and are adopted herein. Superlattice 20 contains a series of ultra-thin layers of alternating materials, said superlattice having an average lattice parameter matched to the immediate end composition of the graded layer 18 thereby acting to lattice match the underlying portion to the succeeding portion (here the high energy gap portion material). For example, assuming $GaAs_{0.7}P_{0.3}$ is the high energy gap material, the superlattice 20 may include approximately ten double layers of GaAs and GaP, the respective thickness of GaAs and GaP sublayers being in the ratio of 7 to 3. It may also be possible to use other types of compounds or materials to obtain the desired lattice match provided the materials are electrically, optically, and mechanically compatible with the device.

On top of superlattice 20 is tunnel junction 22 containing two ultra-thin, highly doped layers, a p+ layer and on top, an n+ layer. The high level of doping results in formation of degenerate carrier states thereby establishing low resistance electrical conduction. In general, junction 22 is an optically transparent low resistance electrical contact between the low energy gap and the high energy gap portions of the semiconductor device. This tunnel junction may also be inserted below superlattice 20. If the tunnel junction introduces strain which degrades subsequent layers, then this would be the preferred embodiment. Superlattice 20 itself may become tunnel junction 22 by heavily doping the semiconductor layers, or a thin metal zone may be diffused into the surrounding semiconductor layers and act as tunnel junction 22. On top of tunnel junction 22 is grown an essential dislocation-free, n-type high energy gap semiconductor layer 24 having the same composition as the end composition of graded layer 18. On top of layer 24 is p-type doped layer 26 which establishes a p-n junction 25 at the interface of layers 24 and 26. Typical processes for preparation of layer 26 include doped epitaxial growth onto layer 24, dopant diffusion into layer 24, or ion implantation into layer 24. The proper thicknesses of layers 24 and 26 are those which produce the most favorable compromise between maximum absorption of incident radiation and highest efficiency collection of minority carrier current. For example, if layers 24 and 26 are too thin, some radiation will not be absorbed and converted to electrical energy. If layer 26 is too thick, it is possible that some of the electrical energy will not be collected due to loss of charge carriers at trapping sites over the excessively long diffusion lengths to the collecting junction 25.

The device is completed by attaching ohmic contact 28 on top of layer 26. Again, the type of ohmic contact 28 is determined by matching the electronic Fermi level of the semiconductor material in layer 26 with the Fermi level of metallic ohmic contact 28. The preferred geometry of ohmic contact 28 is a finger type contact and ought to be thick enough and wide enough to provide a low resistance contact to layer 26 and connection to an external load 30. However, the contact should not be so wide that any substantial portion of the incident electromagnetic radiation is absorbed by contact 28. Note that the electromagnetic energy 31 is incident on the high energy side of the device in this version of the invention in order to maximize absorption efficiency. If we had chosen to use an n-type doped layer 26, rather than a p-type, the characteristic type of all previous layers would be opposite to that discussed.

The placement of superlattice 20 between low and high energy gap portions acts to block propagation of dislocation defects from the low energy gap portion 18 to the high energy gap portion 24. This dislocation blocking effect permits use of low and high energy gap materials with unmatched lattice constants in a simple layered structure. Consequently, the superlattice 20 enables the choice of materials for the low and high energy gap junction layer of the device to be selected strictly on the basis of those energy gap values which will yield optimum efficiency of absorption of electromagnetic radiation and conversion to electrical energy.

During operation, the incident electromagnetic radiation undergoes absorption in the low and high energy gap portions of the device. Absorption of the radiation in layers 12 and 14 and also in layers 24 and 26 creates hole and electron charge carriers in these layers. The minority carriers, the electrons in p-type layers and holes in n-type layers, diffuse to p-n junctions 13 and 25, respectively, where they are collected. In effect, the device becomes an electromagnetic radiation activated battery with two cells in series. As a consequence of the series connection of the low energy and high energy gap portions of the invention, the characteristic voltages of each of the two portions are additive. This effect results in higher electromotive force for a cascade converter device. For example, with the invention attached to a high impedance load and no current flow, the maximum voltage output, the open circuit voltage, may be measured. Using the two junction device example discussed, an open circuit voltage greater than 2.3 volts is anticipated.

The embodiment shown in FIG. 1 may be extended to include more than just a two-junction cascade converter. For example, in FIG. 2 is shown a three-junction monolithic cascade converter device. This device is constructed of the same fundamental components illustrated in FIG. 1. The bottom section of the three junction cascade converter is essentially the same as shown in FIG. 1 with ohmic contact 10A joined to load 30 followed by substrate 12A with a characteristic low energy gap (0.7-1.1 eV for a solar spectrum incident on a solar device at the earth's surface). Assuming we choose an n-type substrate 12A, layer 14A is a p-type doped layer which establishes a p-n junction 13A at the interface of 12A and 14A, a p-type semiconductor overlayer 16A lattice-matched to 14A, layer 18A compositionally graded to achieve a material with a characteristic medium energy gap (1.2-1.5 eV for a solar spectrum incident on a solar device at the earth's surface), a superlattice 20A, and a tunnel junction 22a. This low energy gap portion is followed by a repetition of the genus of layers present in the portion just enumerated, the only change being the characteristic energy gap is now of medium energy. Thus, substrate 12B is n-type and has a characteristic medium energy gap and is followed by a p-type doped layer 14B which forms p-n junction 13B, a p-type semiconductor overlayer 16B, latticed matched to 14B, a p-type doped layer 18B compositionally graded to maintain the lattice matching and also attain a characteristic high energy gap (1.75-1.9 eV for a solar spectrum incident on a solar device at the earth's surface), a superlattice 20B, and tunnel junction 22B (a p+ layer followed by an n+ layer). The uppermost portion is of the same genus as the high energy gap portion of the embodiment shown in FIG. 1 with n-type substrate 24A having a characteristic high energy gap. The three energy gaps of the three corresponding junction portions may be chosen to optimize the absorption of the electromagnetic energy spectrum incident on the device. On top of substrate 24a is p-type doped layer 26A such that p-n junction 25A is established, and the device is completed by attaching ohmic layer 28A on top of 26A and joining 28A to load 30. Note that the electromagnetic energy 31 is incident from the high energy gap side of the device in this particular version of the invention to insure maximum efficiency of absorption of electromagnetic energy and conversion to an electrical energy.

As in the two-junction device, the placement of superlattice 20A between the low and medium energy gap portions and superlattice 20B between the medium and high energy gap portions of the device acts to block propagation of dislocation defects into succeeding active conversion portions, permitting a wide choice of low, medium, and high energy gap materials with unmatched lattice constants. It is also conceivable to formulate a three-junction cascade convertor with layers 16B, 18B, and 20B absent and leaving the low energy gap portion unmodified with only one superlattice required, 20A. This may occur in those instances in which the medium energy gap portion is lattice matched to the high energy gap portion 24A. Similarly the corresponding layers of the low energy gap portion of the device may be absent, requiring the medium energy gap layers to remain unmodified. Such instances as these would be uncommon but even for these cases the use of a superlattice would be highly beneficial to the structural and electrical properties of the next succeeding portion.

The operation of the three-junction device is essentially the same as the two-junction device, with effectively three radiation activated batteries in series. From this series connection of the low, medium, and high energy gap portions of the invention, the characteristic voltages of each cell are additive, resulting in the advantage of a higher electromotive force. This device may be extended to produce an efficient, high electromotive force output cell which has as many energy gap portions as necessary to effect optimum absorption of the incident electromagnetic spectrum and conversion to electrical energy.

Examples of materials for use as the first portion is a three-junction device are Ge or Si. The selection of materials for the other portions would be obvious to one skilled in the art.

The embodiments of the invention in which an exclusive property or privilege is claimed are defined as follows:

1. A device for direct conversion of electromagnetic radiation to electrical energy comprising, a first ohmic contact, a second ohmic contact, semiconductor means for absorbing electromagnetic radiation positioned between said contacts and including at least first and second portions each of which absorbs electromagnetic radiation in a certain energy spectrum and converts the radiation to electrical energy, with said first portion having a first characteristic electromagnetic energy gap and said second portion having a second characteristic electromagnetic energy gap, said second portion having a lattice structure mismatched to the lattice structure of said first portion, layer means positioned between said first and second portions to substantially block propagation of dislocation defects from one portion to another by substantially preventing the dispersion of said dislocation defects through said layer means, and means for effectuating low resistance electrical contact between said portions.

2. The device of claim 1 wherein said means to block propagation of dislocation defects comprises a superlattice structure.

3. The device of claim 2 wherein one of said portions is the first deposited during fabrication and said means to block propagation of dislocation defects further includes a layer lattice matched to and deposited on said one portion first deposited and a compositionally graded layer between said superlattice structure and said layer lattice matched to and deposited on said one portion first deposited.

4. The device of claim 3 wherein said first portion consists of a silicon substrate of one conductivity type having a doped upper layer of opposite conductivity type forming a photovoltaic junction therein.

5. The device of claim 2 wherein said superlattice structure comprises semiconductor materials.

6. The device of claim 5 wherein said means to block propagation of dislocation defects from said first portion to said second portion includes a lattice matched layer of GaP, a compositionally graded layer of $GaAs_xP_{1-x}$, and wherein said superlattice comprises alternating GaAs/GaP layers with an average lattice parameter equal to that of said second portion.

7. The device of claim 1 wherein said means for effectuating low resistance electrical contact between said portions is a highly doped semiconductor tunnel junction.

8. The device of claim 3 wherein said semiconductor tunnel junction is a highly doped superlattice structure.

9. The device of claim 1 wherein said energy gaps are positioned in correlation with one another so as to optimize adsorption of the particular incident electromagnetic energy spectral distribution.

10. The device of claim 1 wherein said first portion has the lowest characeristic energy gap and is positioned at the bottom of said device and said second portion has the highest energy gap and is positioned in said device at the top facing the direction at which the electromagnetic spectrum is intended to be incident.

11. The device of claim 10 wherein said first and second portions have characteristic energy gaps of approximately 1.0-1.2 eV and 1.6-1.8 eV, respectively.

12. The device of claim 11 wherein said first portion is Si and said second portion is $GaAs_{0.7}P_{0.3}$.

13. The device of claim 1 which further includes a third portion having a third characteristic energy gap which is lattice matched to said second portion with layer means positioned between said second and third portions to block propagation of dislocation defects, and means for effectuating low resistance electrical contact between said second and third portions.

14. The device of claim 13 wherein said first, second, and third portions have characteristic energy gaps of approximately 0.7-1.1 eV, 1.2-1.5 eV, and 1.75-1.9 eV, respectively.

15. The device of claim 14 wherein said first portion is selected from the group consisting of Ge or Si.

16. The device of claim 1 which further includes a third portion having a third characteristic energy gap and means for effectuating low resistance electrical contact between said second and third portions.

17. The device of claim 16 wherein said first portion is selected from the group consisting of Ge or Si.

18. The device of claim 1 wherein said layer means is a multiple layer means.

19. The device as described in claim 1, wherein said first and second portions are deposited on a silicon substrate and said first portion comprises silicon.

20. A device for the direct conversion of electromagnetic radiation to electrical energy, comprising a first and second contact means, semiconductor means positioned between said contact means including at least first and second portions each of which absorbs electromagnetic radiation and converts the radiation to electrical energy, with said first portion having a first characteristic electromagnetic energy gap and said second portion having a second characteristic electromagnetic energy gap, said second portion having a lattice structure mismatched to the lattice structure of said first portion, a superlattice member positioned between said first and second portions to substantially block the propagation of dislocation defects from one said portion to the other, and means for effectuating low resistance electrical contact between said portions.

* * * * *